(12) United States Patent
Ehama et al.

(10) Patent No.: US 8,812,572 B2
(45) Date of Patent: Aug. 19, 2014

(54) FILTER PROCESSING DEVICE AND SEMICONDUCTOR DEVICE

(75) Inventors: Masakazu Ehama, Sagamihara (JP); Koji Hosogi, Hiratsuka (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 887 days.

(21) Appl. No.: 13/002,324

(22) PCT Filed: Jun. 26, 2009

(86) PCT No.: PCT/JP2009/002943
§ 371 (c)(1),
(2), (4) Date: Dec. 31, 2010

(87) PCT Pub. No.: WO2010/001562
PCT Pub. Date: Jan. 7, 2010

(65) Prior Publication Data
US 2011/0096879 A1    Apr. 28, 2011

(30) Foreign Application Priority Data
Jul. 2, 2008  (JP) ................. 2008-173105

(51) Int. Cl.
*G06F 17/10* (2006.01)

(52) U.S. Cl.
USPC ........................................ 708/308

(58) Field of Classification Search
CPC ... H03H 17/02; H03H 17/0202; H03H 17/04; H03H 17/06
USPC ............. 708/300, 303, 308, 319, 320
See application file for complete search history.

(56) References Cited

U.S. PATENT DOCUMENTS

| | | | | |
|---|---|---|---|---|
| 6,658,440 | B1* | 12/2003 | Pisek et al. | 708/300 |
| 7,159,002 | B2* | 1/2007 | Gurrapu | 708/320 |
| 2002/0169811 | A1* | 11/2002 | Mackre et al. | 708/303 |
| 2005/0123040 | A1 | 6/2005 | Bjontegard | |
| 2006/0010186 | A1* | 1/2006 | Best et al. | 708/300 |
| 2006/0195498 | A1* | 8/2006 | Dobbek et al. | 708/300 |

FOREIGN PATENT DOCUMENTS

| | | |
|---|---|---|
| JP | 2002-008025 A | 1/2002 |
| JP | 2006-260411 A | 9/2006 |
| JP | 2007-515115 A | 6/2007 |

OTHER PUBLICATIONS

ITU-T H.264 (Mar. 2005), "Advanced video coding for generic audio visual services".

Office Action issued Aug. 2, 2012, in Japanese Patent Application No. 2010-518902.

* cited by examiner

*Primary Examiner* — Chuong D Ngo
(74) *Attorney, Agent, or Firm* — Miles & Stockbridge P.C.

(57) ABSTRACT

The present invention provides a technique for changing the number of taps in filter processing without the need for execution of branch processing. A filter processing device comprises: an arithmetic circuit that performs arithmetic processing for filtering operation; an internal register that retains data to be subjected to arithmetic processing in the arithmetic circuit and that receives the result of arithmetic processing from the arithmetic circuit as data to be written back thereto; and a data generator that generates data to be fed to the arithmetic circuit through use of the data retained in the internal register. Further, in the filter processing device, there is disposed a tap number control circuit that is capable of controlling the number of taps in filter processing according to a tap control signal applied thereto. In this configuration, no branch processing is required for controlling the number of taps by the use of the tap number control circuit.

4 Claims, 10 Drawing Sheets

End-of-filtering signal
Index generator
Shift control circuit

FILTER PROCESSING DEVICE AND SEMICONDUCTOR DEVICE

FIELD OF THE INVENTION

The present invention relates to filter processing devices and semiconductor devices, and more particularly to a filter processing technique applicable thereto.

BACKGROUND OF THE INVENTION

In moving picture processing, it is required to handle interframe motions due to such conditions as movements of objects in respective frames or camera panning operations. Although the contents of the current frame are different from those of the previous frame, there is a high degree of correlation therebetween. Motion compensation is a technique of analyzing pictures for interframe prediction, wherein successive frames are compared to provide motion vector data representing the direction and extent of movement of each object. Through motion compensation, picture data can be reduced in size at a substantially high rate of compression. In most schemes of picture frame coding, it is common practice to partition each picture frame into predetermined blocks of pixels. The use of smaller-sized blocks makes it possible to carry out motion-compensated prediction in further detail. On the other hand, however, due to an increase in the number of blocks, motion vector data tends to increase to cause an increase in the amount of coding, which results in a requirement for higher processing power in hardware. Further, if no filter processing is performed in picture data encoding at a low bit rate, block artifacts are incurred at the step of decoding, and picture data containing the block artifacts is stored into frame memory. Then, at the time of decoding the next frame data through reference to the picture data containing the artifacts, there occurs a propagating condition of picture quality degradation. Hence, for preventing the occurrence of such propagation of picture quality degradation, it is required to carry out filter processing.

In conventional filter processing on picture data, a predetermined number of taps is adopted. Thus, since a filter coefficient value per frame is constant, the same filter processing is performed at any picture position as described in Non-patent Document 1 indicated below.

Further, there is known a technique for performing filter processing on picture data by means of microprogramming (as disclosed in Patent Document 1 indicated below, for example). In this technique, according to a microprogram, picture data is read out of memory and relevant clock data is input to a picture processing section for execution of picture data filtering.

Patent Document 1:
Japanese Unexamined Patent Publication No. 2002-8025
Non-patent Document 1:
ITU-T H.264 (03/2005), "Advanced video coding for generic audio visual services"

SUMMARY OF INVENTION

In examinations conducted by the present inventors regarding the technique for performing filter processing on picture data by means of microprogramming, it has been found that, in cases where the number of taps in filter processing is changed for each macroblock, branch processing is carried out or the maximum number of taps allowable for filter processing is set up with a value of zero assigned to each unnecessary coefficient, thus resulting in an increase in the amount of arithmetic processing.

Further, in common situations where filter processing is performed on the basis of a macroblock corresponding to a unit of picture processing in a frame, the amount of arithmetic processing increases if similar filter processing is repeated for all the macroblocks concerned. It is therefore desirable to control the amount of arithmetic processing according to picture data conditions.

In motion-compensated prediction, it is common practice to interpolatively generate a signal having a pixel precision finer than an integer pixel unit by using pixel value data of a reference picture. The MPEG-2 and MPEG-4 schemes are designed to allow motion compensation with a pixel precision in units down to ½ pixels (half-pels), and the H.264/AVC scheme is designed to allow motion compensation with a pixel precision in units down to ¼ pixels (quarter-pels). When motion-compensated prediction is performed in accordance with any of such coding schemes as mentioned above, there may occur a condition where picture data after discrete cosine transform (DCT) is rich in high frequency components. In this case, the number of taps in filter processing is increased to reduce block noise. Contrastingly, in the case of picture data rich in low-frequency components, substantially no advantageous effects can be obtained by increasing the number of taps in filter processing. Although the total amount of arithmetic processing can be reduced by changing the number of taps in filter processing according to picture data conditions, it is required to carry out branch processing in correspondence with the number of taps concerned. Then, in cases where branch processing in correspondence with the number of taps is required, it becomes necessary to provide a branch prediction circuit. Further, since programs for branch processing are needed, the capacity of program memory or instruction cache must be increased for execution thereof.

It is therefore an object of the present invention to provide a technique for changing the number of taps in filter processing without the need for execution of branch processing.

The above and other objects, novel features, and advantages of the present invention will become more apparent from the following detailed description with reference to the accompanying drawings.

The representative aspects of the present invention are briefed below:

In carrying out the present invention and according to the representative aspects thereof, there is provided a filter processing device comprising: an arithmetic circuit that performs arithmetic processing for filtering operation; an internal register that retains data to be subjected to arithmetic processing in the arithmetic circuit and that receives the result of arithmetic processing from the arithmetic circuit as data to be written back thereto; and a data generator that generates data to be fed to the arithmetic circuit through use of data retained in the internal register. Further, in the filter processing device, there is disposed a tap number control circuit that is capable of controlling the number of taps in filter processing according to a tap number control signal applied thereto. In this configuration, no branch processing is required for controlling the number of taps by the use of the tap number control circuit.

To sum up, the following advantageous effect is provided according to the representative aspects of the present invention:

In accordance with the present invention, it is possible to change the number of taps in filter processing without the need for execution of branch processing.

DETAILED DESCRIPTION OF THE PREFERRED EMBODIMENTS

1. Representative Preferred Embodiments

Figure 1:
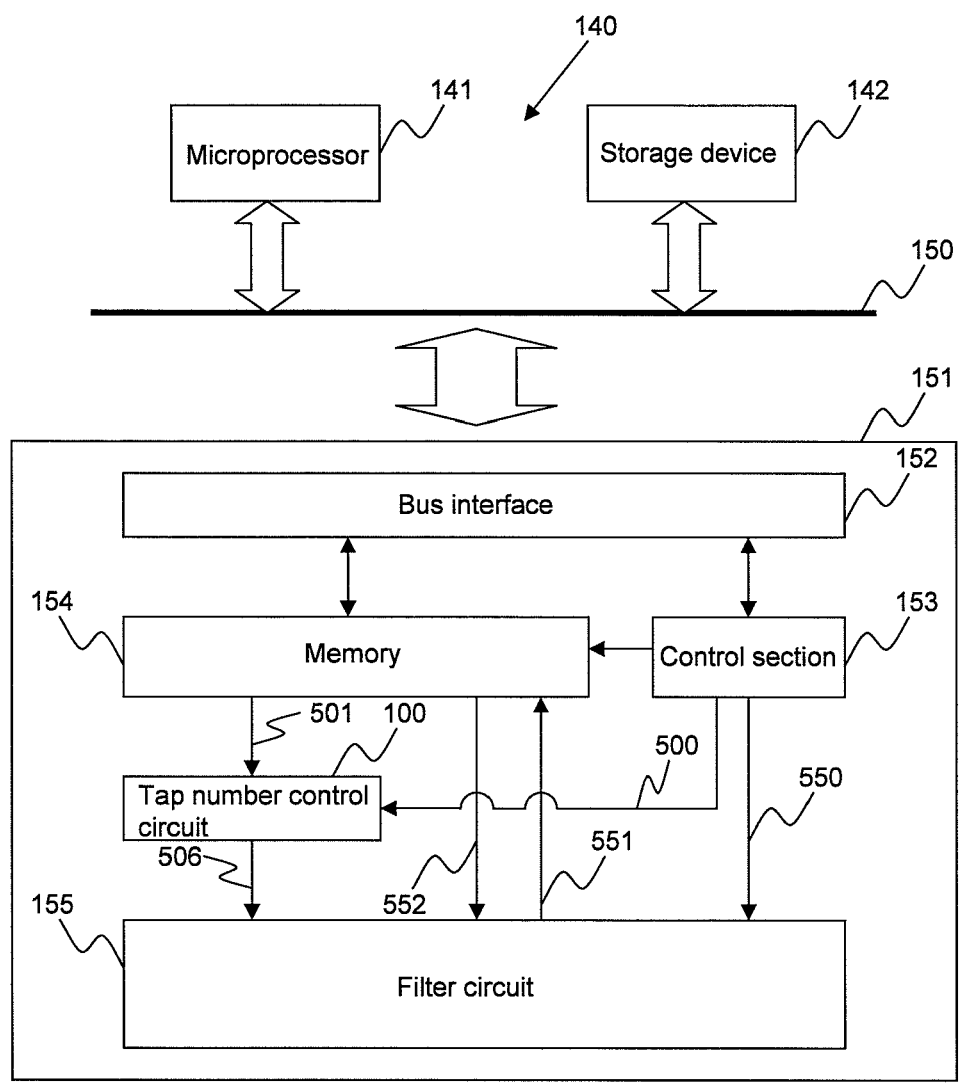
FIG. 1 is a block diagram showing an exemplary configuration of an image processing system incorporating a filter processing device according to the present invention.

First, the present invention will be described below regarding the overviews of representative preferred embodiments thereof. It is to be noted that, in the following description of the overviews of the representative preferred embodiments, parenthesized reference numerals are used for illustrative purposes only and designate respective parts that are included in the concepts of corresponding component elements identified by reference numerals in the accompanying drawings.

[1] In accordance with a representative preferred embodiment of the present invention, there is provided a filter processing device (151) comprising: an arithmetic circuit (112) that performs arithmetic processing for filtering operation; an internal register (110) that retains data to be subjected to arithmetic processing in the arithmetic circuit and that receives the result of arithmetic processing from the arithmetic circuit as data to be written back thereto; and a data generator (111) that generates data to be fed to the arithmetic circuit through use of the data retained in the internal register. The filter processing device (151) further has a tap number control circuit (100) that is capable of controlling the number of taps in filter processing according to a tap control signal applied thereto.

In this configuration wherein the tap number control circuit controls the number of taps in filter processing according to the tap control signal applied thereto, no branch processing is required for tap number control implementation. Thus, it is possible to provide a technique for changing the number of taps in filter processing without the need for execution of branch processing.

[2] With regard to item [1] mentioned above, there may be provided an arrangement wherein the tap number control circuit comprises: a tap number control register (102) that retains the number of taps in filter processing; a tap number counter (103) that updates a count value at each end of arithmetic processing for one tap according to a count value update signal; a controller (101) that sets up an initial value in the tap number control register and that initializes the tap number counter; and a comparator (104) that performs a comparison between data retained in the tap number control register and a value indicated by the tap number counter, and that outputs the result of comparison to the data generator.

[3] Further, with regard to item [1] mentioned above, there may be provided an arrangement wherein a control section is so formed as to comprise a central processing unit (CPU) capable of carrying out an instruction for updating the tap number control register.

[4] Still further, with regard to item [1] mentioned above, there may be provided an arrangement wherein the filter processing device is coupled to a bus (150), and the tap number control register (102) is mapped in a memory map area accessible from the bus.

[5] Furthermore, with regard to item [1] mentioned above, there may be provided an arrangement wherein, at the time of initialization of the tap number counter by the controller, data retained in the tap number control register is set up in the tap number counter, a value indicated by the tap number counter is decremented according to a count value update signal received from the controller, and through comparison by the comparator, a judgment is performed on whether a count value of zero is set up or not.

[6] Moreover, with regard to item [1] mentioned above, there may be provided an arrangement wherein the filter processing device is formed in a single semiconductor substrate.

[7] Still further, with regard to item [1] mentioned above, there may be provided an arrangement wherein encoded picture data is input to the filter processing device through the bus; and wherein a value to be set up in the tap number control register is provided in streaming of the encoded picture data.

[8] In accordance with another representative preferred embodiment of the present invention, there is provided a semiconductor device comprising: an instruction decoder (130) that decodes input instructions; a tap number control circuit (100) that is capable of controlling the number of taps in filter processing according to a tap control signal applied thereto through the instruction decoder; an index generator (131) that is capable of generating an offset source index by compensation of a source index received through the instruction decoder; an internal register (132) that is capable of outputting data corresponding to the source index; and an arithmetic circuit (112) that performs arithmetic processing for filtering operation on data fed from the internal register. In this arrangement, the arithmetic circuit comprises: a shift register (134) that is capable of shifting data fed from the internal register; and a single-instruction multiple-data (SIMD) arithmetic circuit (135) that performs arithmetic processing on output data from the shift register. Further, the tap number control circuit comprises: a horizontal tap number control register (121) that is capable of retaining the number of taps in horizontal filter processing and capable of updating the number of taps retained therein according to update data; a vertical tap number control register (120) that is capable of retaining the number of taps in vertical filter processing and capable of updating the number of taps retained therein according to update data; a horizontal tap number counter (122) and a vertical tap number counter (124), each being arranged to change a count value according to a count value update signal; a controller (101) that sets up an initial value in each of the horizontal tap number control register and the vertical tap number control register according to a control signal output from the instruction decoder, and that initializes each of the horizontal tap number counter and the vertical tap number counter according thereto; a first comparator (123) that performs a comparison between a value retained in the horizontal tap number control register and a value indicated by the horizontal tap number counter, and that serves to operate the shift register and to update the vertical tap number counter according to the result of comparison; and a second comparator (125) that performs a comparison between a value retained in the vertical tap number control register and a value indicated by the vertical tap number counter, and that issues an end-of-filtering signal according to the result of comparison.

[9] With regard to item [8] mentioned above, there may be provided an arrangement wherein, at each end of horizontal filter processing for one tap, a value indicated by the horizontal tap number counter (122) is updated, and the updated value is compared with data retained in the horizontal tap number control register (121) to check whether the horizontal filter processing concerned has been completed or not, then if it is judged that the horizontal filter processing concerned has not yet been completed, the first comparator (123) asserts a shift signal for shift register operation. Further, at each end of vertical filter processing for one tap, a value indicated by the vertical tap number counter (124) is updated, the current number of taps is compared with a register index change signal for changing a register number read out of the internal register, and data indicated by the vertical tap number counter (124) is compared with data retained in the vertical tap number control register (120) to check whether the vertical filter processing concerned has been completed or not, then if it is judged that the vertical filter processing concerned has been completed, the second comparator (125) asserts an end-of-filtering signal.

[10] Further, with regard to item [8] mentioned above, there may be provided an arrangement wherein, upon receiving, from the instruction decoder (130), a control signal for updating either one or both of the horizontal tap number control register (121) and the vertical tap number control register (120), the controller (101) asserts an enable signal for updating either one or both of the horizontal tap number control register and the vertical tap number control register; and wherein, upon receiving, from the instruction decoder (130), a control signal for starting the execution of a filtering instruction, the controller (101) asserts a reset signal for resetting the horizontal tap number counter (122) and the vertical tap number counter (124).

[11] With regard to item [10] mentioned above, there may be provided an arrangement wherein the instruction decoder is configured to decode an instruction that is capable of updating either one or both of the vertical tap number control register and the horizontal tap number control register.

2. Details of the Preferred Embodiments

The following further describes the details of preferred embodiments of the present invention.

Processing Steps Assumed in Implementation:

Described first below is a series of processing steps for motion-compensated prediction assumed to be performed in implementation of the preferred embodiments of the present invention.

In motion-compensation prediction, it is common practice to interpolatively generate a signal having a pixel precision finer than an integer pixel unit by using pixel value data of a reference picture. The MPEG-2 and MPEG-4 schemes are designed to allow motion compensation with a pixel precision in units down to ½ pixels (half-pels), and the H.264/AVC scheme is designed to allow motion compensation with a pixel precision in units down to ¼ pixels (quarter-pels).

In the H.264/AVC scheme, the procedure for pixel derivation is carried out through two stages; derivation of ½-unit pixel (half-pel) data, and derivation of ¼-unit pixel (quarter-pel) data. First, ½-unit pixel data is derived from reference picture data according to a calculating formula (six-tap FIR filter processing). Then, based on the reference picture data and the ½-unit pixel data determined through the six-tap FIR filter processing, ¼-unit pixel data and ¾-unit pixel data are derived (two-tap filter processing).

Figure 7:
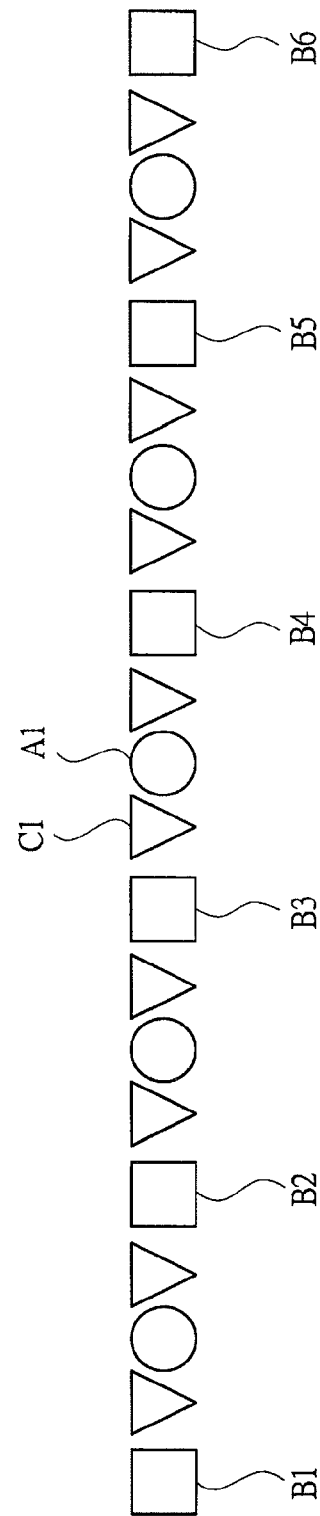
FIG. 7 is a conceptual diagram for explaining six-tap FIR filter processing and two-tap filter processing.

Referring to FIG. 7, there is shown a conceptual diagram of six-tap FIR filter processing and two-tap filter processing to be performed for derivation from integer pixel data. In this figure, A1 indicated as a circle "○" represents ½-unit pixel data to be derived, and each of B1, B2, B3, B4, B5, and B6 indicated as a square "□" represents reference pixel data (integer pixel data).

In derivation of ½-unit pixel data A1, calculation is performed on preceding and succeeding integer pixel data B1, B2, B3, B4, B5, and B6 as expressed by the following equation.

$$A1=(B1-5\times B2+20\times B3+20\times B4-5\times B5+B6+16)/32 \qquad \text{(Eq. 1)}$$

Further, in two-tap filter processing, ¼-unit pixel data C1 indicted as an inverted triangle "△" is derived as expressed by the following equation.

$$C1=(A1+B3+1)/2 \qquad \text{(Eq. 2)}$$

Thus, in cases where data of 8 horizontal pixels by 8 vertical pixels is processed in units of quarter-pels, it is required to provide data of 14 horizontal pixels by 14 vertical pixels as reference picture data. This conditional requirement is also applied to the present invention.

If it is possible to collectively store 14-pixel data into memory and perform processing on the 14-pixel data thus stored, no problem will occur in motion-compensated prediction. However, the provision of an arithmetic circuit for collectively processing 14-pixel data is practically infeasible in terms of circuit implementation scale in most cases (one pixel is assumed to be one byte in size in the present invention).

Figure 8:
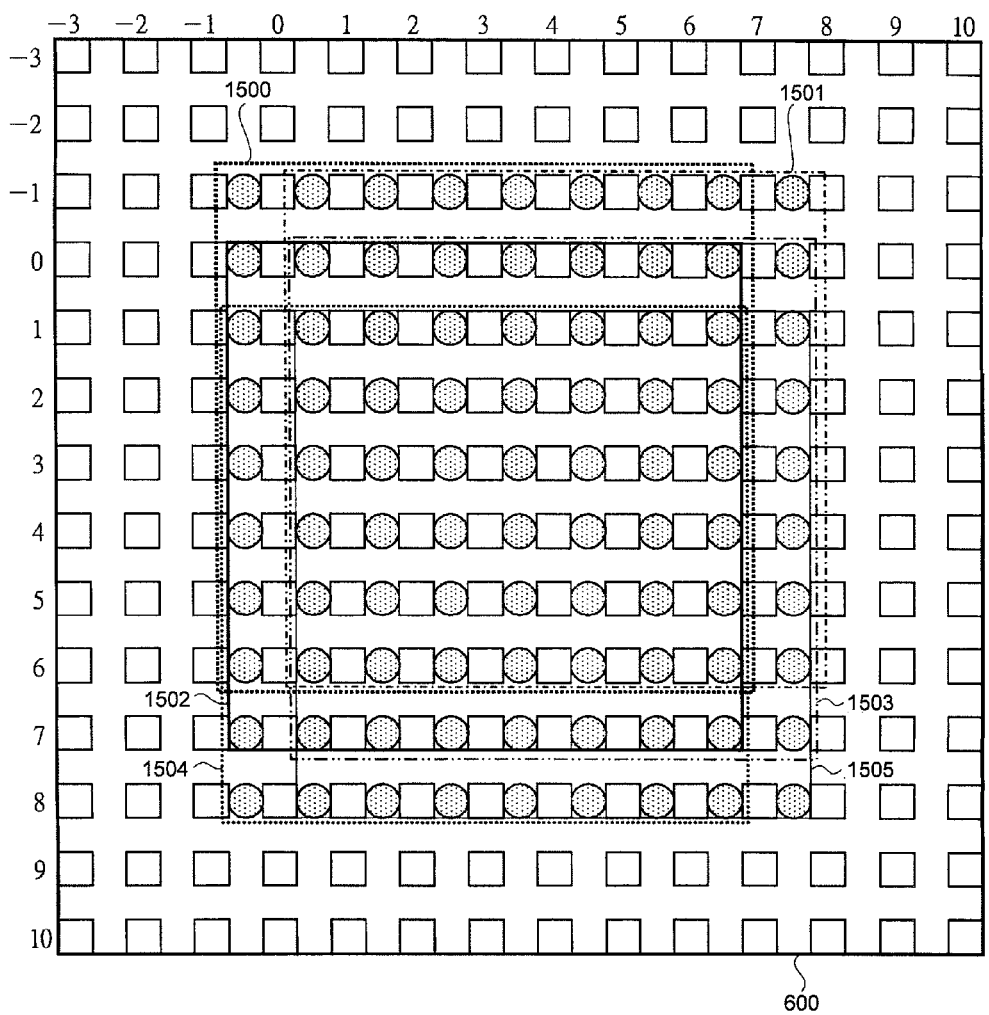
FIG. 8 is a conceptual diagram for explaining horizontal six-tap FIR filter processing.

Referring to FIG. 8, there is shown a conceptual diagram of horizontal six-tap FIR filter processing, which is carried out to derive a picture of 9 horizontal pixels by 10 vertical pixels in a region of (−½, −1) to (7+½, 8).

As mentioned above, in motion compensation with respect to the entire picture area concerned, it is required to provide data of 14 horizontal pixels by 14 vertical pixels as reference picture data 600 (input picture). However, in practical applications, if it is arranged to handle data of the entire picture area at a time through a single read-out operation, there may arise considerable difficulty in circuit implementation due to such a design constraint as a data bus width. Contrastingly, in the horizontal six-tap FIR filter processing, a reference is made to a region of 14 horizontal pixels by 10 vertical pixels that is delineated by (−3, −1), (10, −1), (10, 8), and (−3, 8). Thus, this pixel region is read into an internal register or the like temporarily.

In calculation of horizontal ½-unit pixel (half-pel) data corresponding to a picture of 9 horizontal pixels by 10 vertical pixels through use of eight arithmetic circuit parts, a pixel region 1500 delineated by (−½, −1), (6+½, −1), (6+½, 6), and (−½, 6) (enclosed by the dotted line) is determined with (0, 0) as a base point. For derivation of the pixel region 1500, integer pixel data of a pixel region delineated by (−3, −1), (9, −1), (9, 6), and (−3, 6) is used through extraction from the input picture 600. More specifically, in calculation of coordinate data (−½, −1), six pixel values ranging from (−3, −1) to (3, −1) are substituted into Equation 1. Further, for determining a pixel region 1501 delineated by (½, −1), (7+½, −1), (7+½, 6), and (½, 6) (enclosed by the dashed single-dotted line), a total of eight pixels in the horizontal direction are used as one line in calculation.

Likewise, a similar processing is performed on a pixel region 1502 of 8 horizontal pixels by 8 vertical pixels with (−½, 0) as a base point (enclosed by the solid line), a pixel region 1503 of 8 horizontal pixels by 8 vertical pixels with (½, 0) as a base point (enclosed by the dashed double-dotted line), a pixel region 1504 of 8 horizontal pixels by 8 vertical pixels with (−½, 1) as a base point (enclosed by the thin dotted line), and a pixel region 1505 of 8 horizontal pixels by 8 vertical pixels with (½, 1) as a base point (enclosed by the thin solid line).

According to the results of these processing steps, horizontal ½-unit pixel (half-pel) data regarding a picture of 9 horizontal pixels by 10 vertical pixels can be determined.

Figure 9:
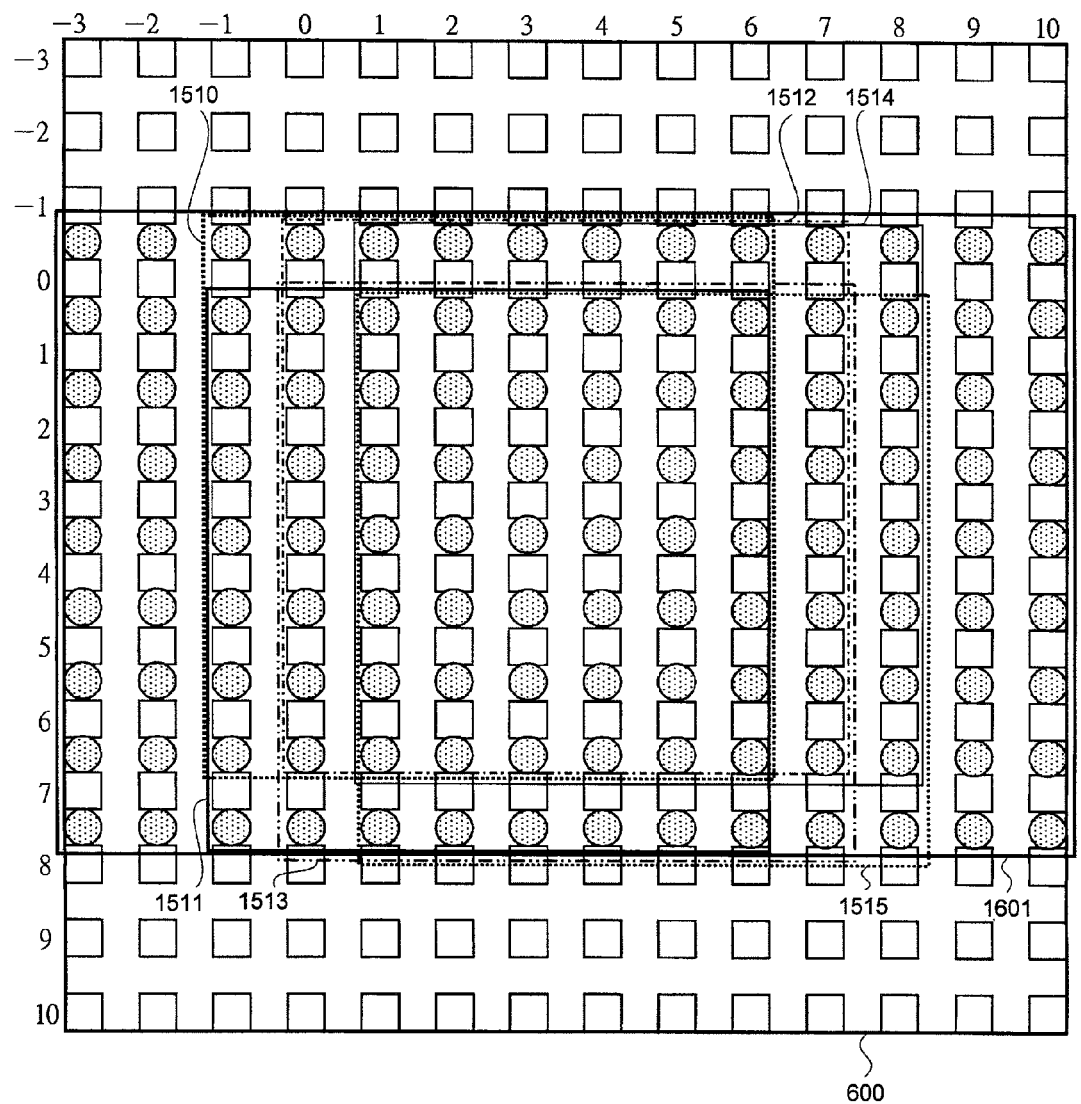
FIG. 9 is a conceptual diagram for explaining vertical six-tap FIR filter processing.

Referring to FIG. 9, there is shown a conceptual diagram of vertical six-tap FIR filter processing, which is carried out to derive a picture of horizontal 10 pixels by 9 vertical pixels with respect to (−1, −½). Similarly to the case described with reference to FIG. 8, a pixel region 1510 of 8 horizontal pixels by 8 vertical pixels with respect to (−1, −½) (enclosed by the dotted line) is determined with (0, 0) as a base point. For calculation thereof, integer pixel data of a pixel region delineated by (−1, −3), (6, −3), (6, 9), and (−1, 9) is used through extraction from the input picture 600. More specifically, in calculation of coordinate data (−1, −½), six pixel values of (−1, −3), (−1, −2), (−1, −1), (−1, 0), (−1, 1), and (−1, 2) are substituted into Equation 1 in the same manner as that described above. Further, for determining a pixel region 1511 of 10 horizontal pixels by 9 vertical pixels with (−1, ½) as a base point (enclosed by the solid line), a total of nine pixels in the vertical direction are used as one line in calculation, and the data of one line thus calculated is stored into an internal register of a processor.

Likewise, a similar processing is performed on a pixel region 1512 with (0, −½) as a base point (enclosed by the dashed single-dotted line), a pixel region 1513 with (0, ½) as a base point (enclosed by the dashed double-dotted line), a pixel region 1514 with (1, −½) as a base point (enclosed by the thin solid line), and a pixel region 1515 with (1, ½) as a base point (enclosed by the thin dotted line). Resultantly, vertical ½-unit pixel (half-pel) data regarding a picture of 9 horizontal pixels by 10 vertical pixels is stored into the internal register of the processor.

Note that, in this example, since diagonal ½-unit pixel (half-pel) data to be described below is derived by using the vertical ½-unit pixel (half-pel) data, a pixel region 1601 delineated by (−3, −½), (10, −½), (10, 7+½), and (−3, 7+½) is extracted.

Figure 10:
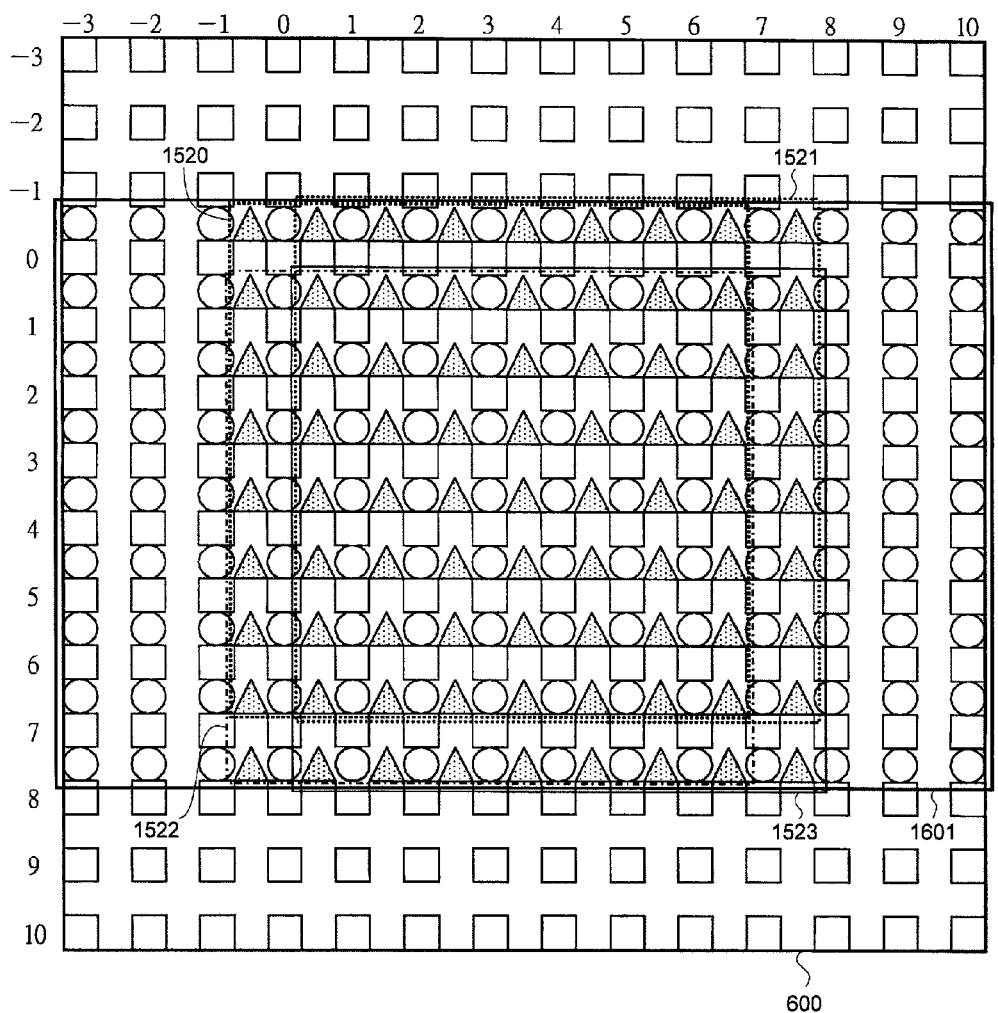
FIG. 10 is a conceptual diagram for explaining diagonal six-tap FIR filter processing.

Based on the results of the derivation processing steps mentioned above, diagonal pixel data is calculated. Referring to FIG. 10, there is shown a conceptual diagram of diagonal six-tap FIR filter processing. For determination of diagonal pixel data, the six-tap FIR filter processing is also carried out by using the results of the horizontal filter processing illustrated in FIG. 8 or the results of the vertical filter processing illustrated in FIG. 9.

In the diagonal six-tap FIR filter processing, the following pixel regions are determined; a pixel region 1520 with (−½, −½) as a base point (enclosed by the dotted line), a pixel region 1521 with (½, −½) as a base point (enclosed by the thin dotted line), a pixel region 1522 with (−½, ½) as a base point (enclosed by the dashed single-dotted line), and a pixel region 1523 with (½, ½) as a base point (enclosed by the solid line). Through synthesis of these pixel regions, a picture of 9 horizontal pixels by 9 vertical pixels in diagonal filtering is produced. In this case, the pixel region 1601 ranging from (−3, −½) to (10, 7+½) is used as reference pixel data required for derivation from the result of vertical six-tap FIR filter processing. With respect to the pixel region 1601, horizontal six-tap FIR filter processing is carried out to determine a diagonally filtered picture of 9 horizontal pixels by 9 vertical pixels. The resultant data is stored into the internal register of the processor.

Then, using picture data calculated in the vertical, horizontal, and diagonal directions, ¼-unit pixel (quarter-pel) data is determined. Equation 2 is applied to calculation of ¼-unit pixel data. Thus, picture data to be used is determined according to motion vectors.

Figure 11:
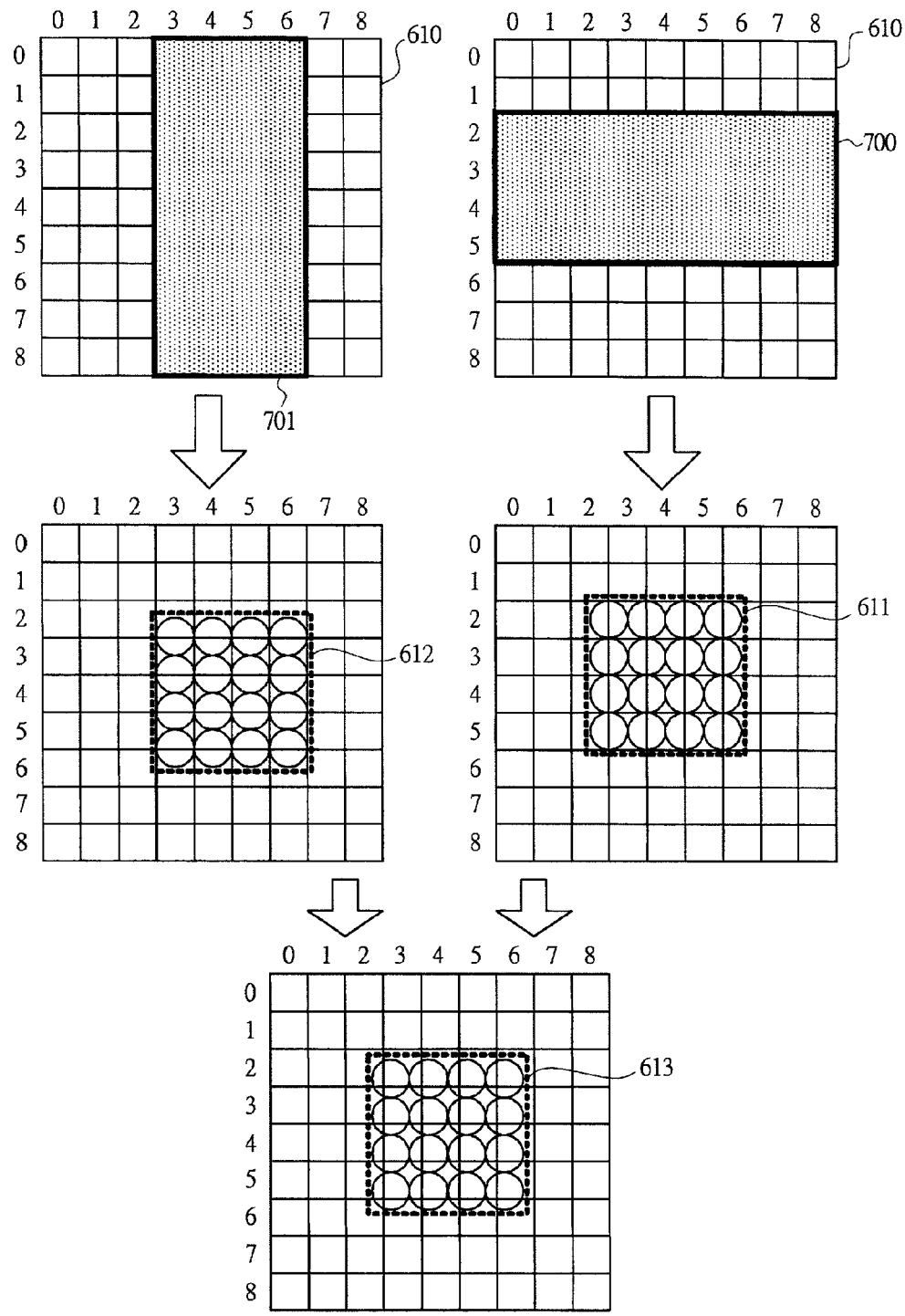
FIG. 11 is a conceptual diagram for explaining two-tap filter processing.

Referring to FIG. 11, there is shown a conceptual diagram of secondary two-tap filter processing for derivation of pixel data of 4 horizontal pixels by 4 vertical pixels. While six-tap FIR filter processing is performed in the primary operation stage, two-tap filter processing is carried out in the secondary operation stage. For determining a picture of 4 by 4 pixels, pixel data of 9 by 9 pixels is used. In the internal register, data of nine-byte width is stored per entry, and reference picture data 610 is stored as a total of nine entries in the internal register. To obtain a picture of (½, ½) with respect to a reference coordinate point in FIG. 11, pixel data 700 ranging from entries 2 to 5 is used through extraction from the reference pixel data 610. By carrying out horizontal six-tap filtering, a half-pel picture 611 is produced. Further, using all the entries, vertical six-tap filtering is performed. In derivation of a half-pel picture 612, only the third to sixth bytes viewed from the leftmost byte position are used. With the half-pel pictures 611 and 612, two-tap filtering is performed in the secondary operation stage to produce a quarter-pel picture 613. Thus, since one line of data is stored in the internal register, it is possible to carry out read-out and arithmetic operations readily.

The preferred embodiments of the present invention are so arranged as to enable efficient execution of the above-mentioned series of processing steps with the use of limited hardware resources.

Preferred Embodiment 1:

Referring to FIG. 1, there is shown a block diagram of an exemplary configuration of an image processing system incorporating a filter processing device according to the present invention. As shown in FIG. 1, an image processing system 140 comprises a microprocessor 141, a storage device 142, and a filter processing device 150, which are coupled mutually through a bus 150, though not particularly limited thereto. The microprocessor 141 controls overall operation of the image processing system 140 through execution of predetermined programs. The storage device 142 is used to store the programs to be executed by the microprocessor 141 along with a variety of data. The filter processing device 151 is arranged to perform two-dimensional filtering of picture data supplied through the bus 150.

In the filter processing device 151, the FIR filter processing described above is carried out. The filter processing device 151 comprises a bus interface 152, a control section 153, a memory 154, a tap number control circuit 100, and a filter circuit 155, which are formed in a semiconductor substrate such as a single-crystal silicon substrate by using known semiconductor integrated circuit fabrication techniques, though not particularly limited thereto. The bus interface 152 serves to allow communication of various kinds of information with a host CPU (central processing unit) coupled to the bus 150. These various kinds of information include picture data before/after filtering and control information regarding operations for filtering. In particular, at the time of input of encoded picture data to the filter processing device 151 through the bus 150, value data to be set in the tap number control circuit 100 can be contained in streaming of the encoded picture data. Thus, the relevant value data is fed to the filter processing device 151. The control section 153 comprises a CPU (central processing unit) capable of executing instructions received through the bus interface 152, for example. In the control section 153, a tap control signal 500 and a filter control signal 550 are formed. The memory 154 is used to temporarily store tap number update data for filtering operation to be performed in the filter circuit 155, data to be subjected to filtering, and result data of filtering. The filter circuit 155 carries out filtering operation on data 552 received via the memory 154. On completion of filter processing, result data thereof 551 is written back to the memory 154, and then the result data 551 is output to the bus 150 through the bus interface 152. The tap number control circuit 100 serves to change the number of taps in filter processing in the filter circuit 155 according to tap number update data 501 fed via the memory 154.

Note that, for picture data communication with external circuitry, a dedicated line may be used in lieu of the bus 150.

In the circuit configuration mentioned above, picture data fed through the bus 150 is temporarily stored into the memory 154. When data sufficient for filter processing is input and a startup instruction is issued from the microprocessor 141 to the control section 153 through the bus 150, the filter processing device 151 initiates filter processing. Further, under the direction of the control section 153, the number of taps based on the tap number update data 501 stored in the memory 154 is set up in the tap number control circuit 100 according to the tap number control signal 500. Note that, instead of storing the tap number update data 501 in the memory 154, the tap number update data 501 may be written directly into an internal register of the tap number control circuit 100 through the bus 150 before the start of filter processing in the filter processing device 151. On completion of tap number setting, picture data stored in the memory 154 is input to the filter circuit 155 as required. According to the setting in the tap number control circuit 100, filter processing is carried out, and the result data thereof is written back to the memory 154.

Figure 2:
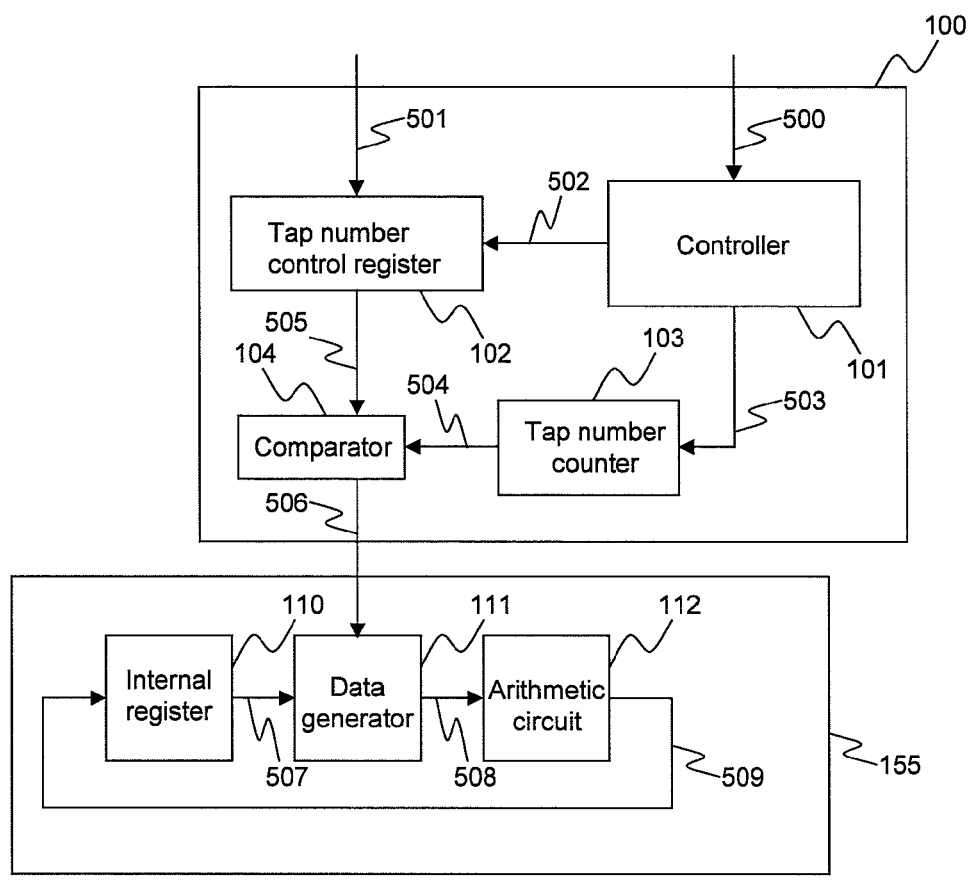
FIG. 2 is a block diagram showing exemplary configurations of a tap number control circuit and a filter circuit in the filter processing device.

Referring to FIG. 2, there is shown a block diagram of exemplary configurations of the tap number control circuit 100 and the filter circuit 155.

The tap number control circuit 100 comprises a controller 101, a tap number control register 102, a tap number counter 103, and a comparator 104. The tap number control register 102 is used to retain the number of taps in filter processing. Under the direction of the controller 101, initial value setting in the tap number control register 102 and initialization in the tap number counter 103 are performed according to control signals 502 and 503. The control signals 502 and 503 are generated by the controller 101, based on the tap control signal 500 received from the control section 153. The tap number counter 103 receives a count value update signal from the controller 101. According thereto, the tap number counter 103 is updated at each end of arithmetic processing for one tap. Thus, the count value held in the tap number counter 103 is changed. The comparator 104 performs a comparison between data retained in the tap number control register 102 and a value indicated by the tap number counter 103. The result of this comparison is fed to the filter circuit 155.

The filter circuit 155 comprises an internal register 110, a data generator 111, and an arithmetic circuit 112. The arithmetic circuit 112 carries out arithmetic processing for filtering operation. The internal register 110 is used to retain data to be subjected to arithmetic processing by the arithmetic circuit 112. Further, the internal register 110 is also used to receive the result of arithmetic processing from the arithmetic circuit 112 as data to be written back thereto. According to data retained in the internal register 110, the data generator 111 produces data to be fed to the arithmetic circuit 112.

In the tap number control circuit 100, the tap number control register 102 is updated upon receipt of the tap control signal 500 from the control section 153. For updating the tap number control register 102, the tap number update data 501 is set up as new data therein according to the tap number update signal 502. Then, for execution of filter processing, the counter reset signal 503 is input to the tap number counter 103 to reset data that has been retained therein. At each execution of filter processing for one tap, the tap number counter 103 is incremented by one ("+1"), and in the comparator 104, a judgment is performed on whether an output value 504 of the tap number counter 103 is equal to an output value 505 of the tap number control register 102. Note that, for resetting the tap number counter 103 according to the counter reset signal 503, the output value 505 of the tap number control register 102 may be set in the tap number counter 103. In this case, at each execution of filter processing for one tap, the tap number counter 103 is decremented by one ("−1"), and in the comparator 104, a comparison with "0" is performed.

If, in the result of comparison by the comparator 104, the output value 504 of the tap number counter 103 is equal to the output value 505 of the tap number control register 102, it is recognized that the filter processing concerned has been completed. Then, an equivalence signal 506 is asserted to a logical value of "1", for example, thereby indicating the completion of the filter processing concerned to the data generator 111. Alternatively, if the output value 504 of the tap number counter 103 is not equal to the output value 505 of the tap number register 102, data 507 read out of the internal register 110 is processed by the data generator 111. Then, arithmetic processing is carried out in the arithmetic circuit 112, and the result data of arithmetic processing 509 is written back to the internal register 110. Thus, the number of taps in filter processing is determined according to value data set up in the tap number control register 102.

Note that value data may be set up in the tap number control register 102 through use of a dedicated setup instruction or at the initial step of execution of a filtering instruction.

In accordance with the preferred embodiment described above, it is possible to provide the following advantageous effects.

With the provision of the tap number control register 102, the number of taps in two-dimensional filtering can be changed in the filter circuit 155 according to data set up in the tap number control register 102. Thus, the filter processing device 151 capable of two-dimensional filtering with a variable number of taps is configured. In the image processing system 140 incorporating the filter processing device 151, it is allowed to change the number of taps appropriately by updating data regained in the tap number control register 102. Further, at the time of changing the number of taps appropriately, no branch processing is required regardless of the number of taps, thus enabling enhancement in performance and eliminating the need for a branch prediction circuit. Since there is no requirement for branch processing, it is possible to obviate an increase in memory size required for CPU programs included in the control section 153.

Figure 3:
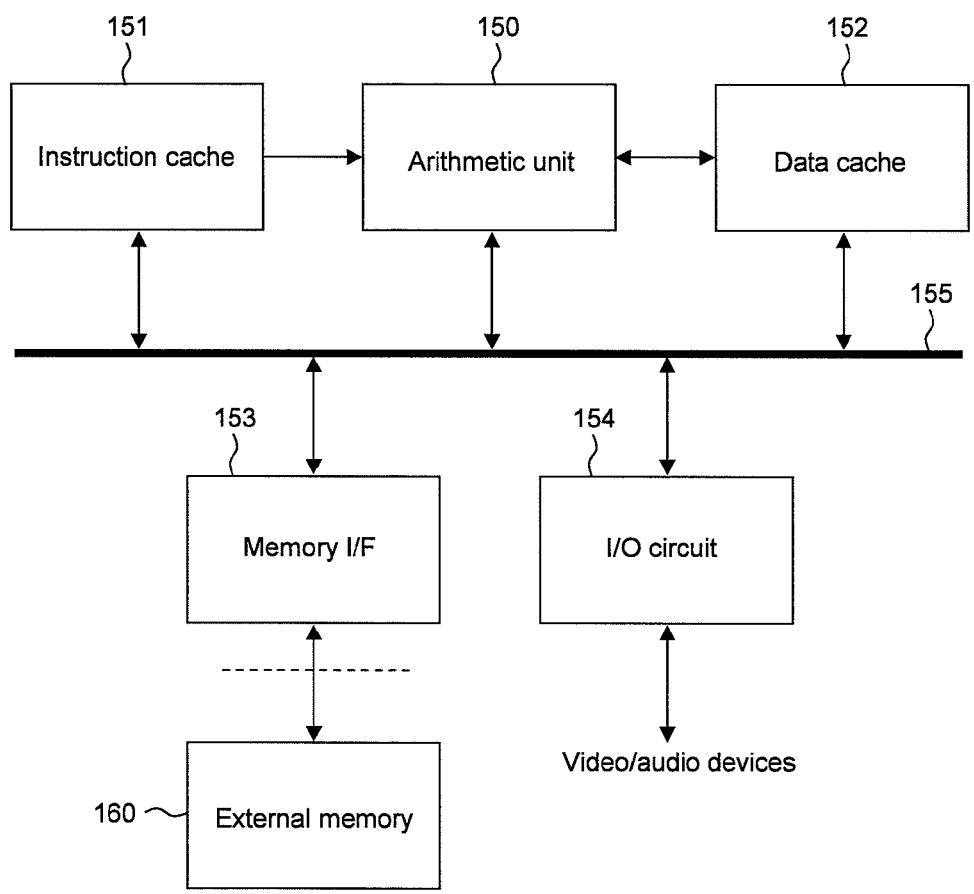
FIG. 3 is a block diagram showing an exemplary configuration of a processor in an illustrative implementation of a semiconductor device according to the present invention.

Preferred Embodiment 2:

Referring to FIG. 3, there is shown a block diagram of an exemplary configuration of a processor in an illustrative implementation of a semiconductor device according to the present invention. The processor shown in FIG. 3 comprises an instruction cache 351, an arithmetic unit 350, a data cache 352, a memory I/F (interface) 353, and an I/O (input/output) circuit 354, which are formed in a semiconductor substrate such as a single-crystal silicon substrate by using known semiconductor integrated circuit techniques. The arithmetic unit 350 carries out instructions fetched via the instruction cache 351 to perform predetermined arithmetic processing. At the time of outputting the arithmetic processing result data according to a store instruction or the like, the arithmetic processing result data is fed to the data cache 352 for temporary retention therein, or fed to an external memory 360 for retention therein through an internal bus 355 and the memory I/F 353. Further, data communication with low-speed video/audio devices through interfacing of the I/O circuit 354 can be performed by way of the internal bus 355.

Figure 4:
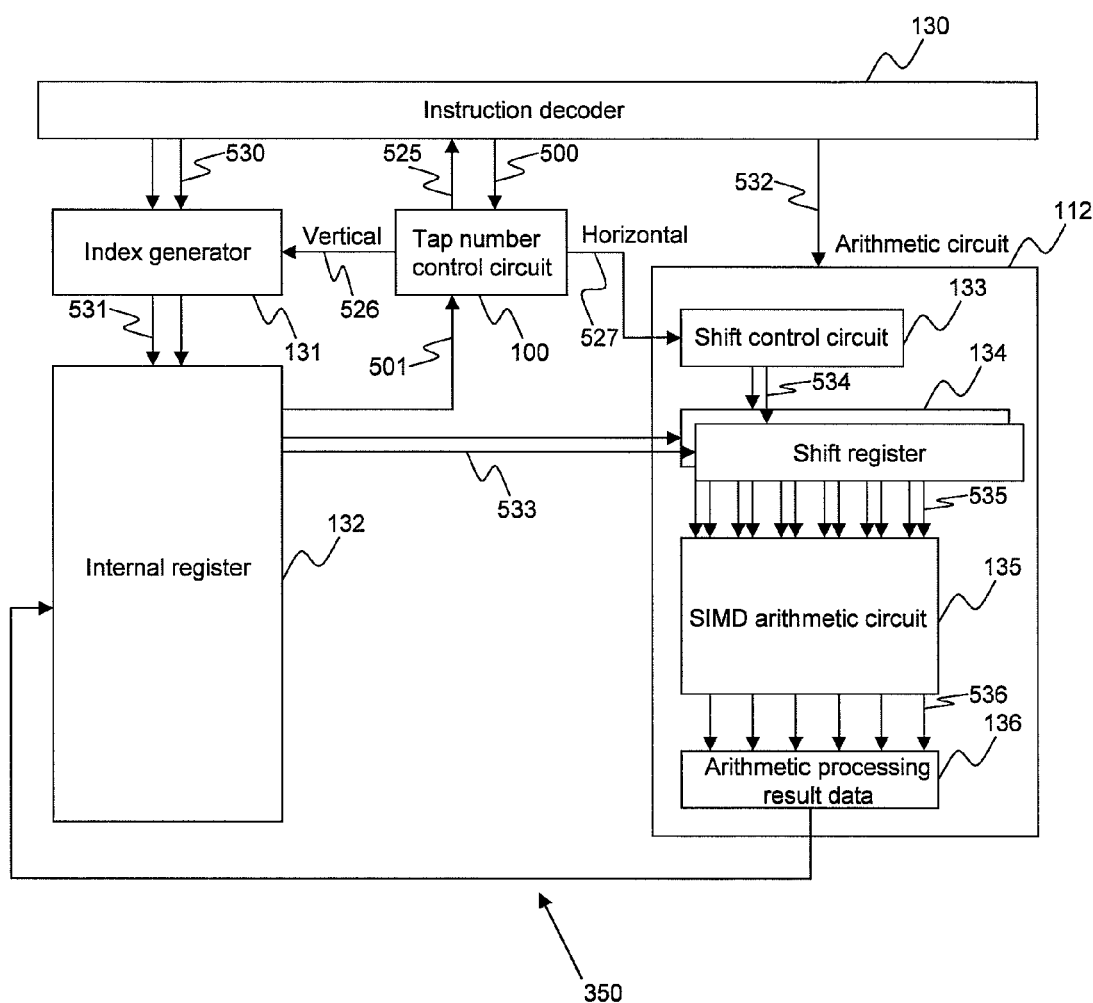
FIG. 4 is a block diagram showing an exemplary configuration of an arithmetic unit in the processor.

Referring to FIG. 4, there is shown a block diagram of an exemplary configuration of the arithmetic unit 350 mentioned above.

The arithmetic unit 350 shown in FIG. 4, which is designed to carry out the FIR filter processing, comprises a tap number control circuit 100, an arithmetic circuit 112, an instruction decoder 130, an index generator 131, and an internal register 132, though not particularly limited thereto. The instruction decoder 130 decodes input instructions to produce a tap control signal 500, a source index 530, and an arithmetic control signal 532. The tap number control circuit 100 receives the tap control signal 500 from the instruction decoder 130, and according thereto, the tap number control circuit 100 controls the number of taps in filtering. The index generator 131 receives the source index from the instruction decoder 130, and generates an offset source index 530 through compensation thereof. The internal register 132 retains data to be subjected to filtering, and also outputs data corresponding to the source index. The arithmetic circuit 112 performs arithmetic processing for filtering operation on data 533 fed from the internal register 132. The arithmetic circuit 112 comprises a shift register 134 that is capable of shifting data fed from the internal register 132, a shift control circuit 133 that controls data shifting in the shift register 134, and an SIMD arithmetic circuit 135 that performs arithmetic processing on output data from the shift register 134. The acronym "SIMD" as used herein stands for "single-instruction multiple-data", and SIMD arithmetic processing denotes an arithmetic scheme in which multiple data are processed simultaneously by using a single instruction. The result data of arithmetic processing in the SIMD arithmetic circuit 135 is written back to the internal register 132.

Figure 5:
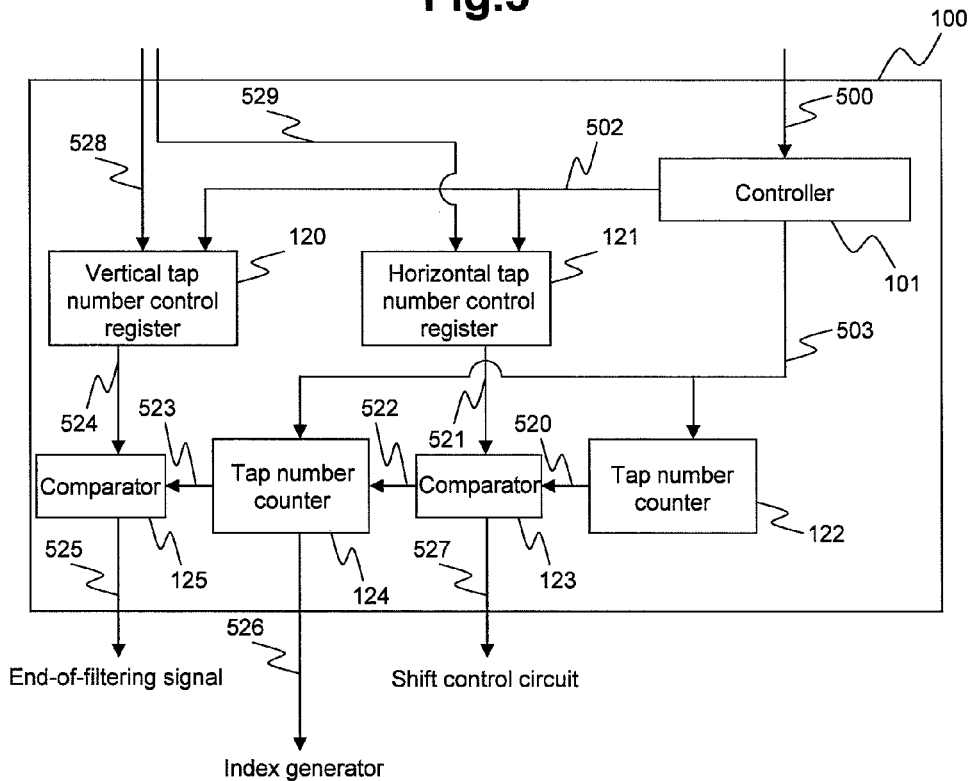
FIG. 5 is a block diagram showing an exemplary configuration of a tap number control circuit in the arithmetic unit.

Referring to FIG. 5, there is shown a block diagram of an exemplary configuration of the tap number control circuit 100 indicated in FIG. 4.

The tap number control circuit 100 shown in FIG. 5 comprises a controller 101, a vertical tap number control register 120, a horizontal tap number control register 121, a horizontal tap number counter 122, a comparator 123, a vertical tap number counter 124, and a comparator 125. In the vertical tap number control register 120, it is allowed to set up a vertical tap control signal for two-dimensional picture filtering. In the horizontal tap number control register 121, it is allowed to set up a horizontal tap control signal for two-dimensional picture filtering. The comparator 125 performs a comparison between an output value 524 of the vertical tap number control register 120 and an output value 523 of the vertical tap number counter 124. The comparator 123 performs a comparison between an output value 521 of the horizontal tap number control register 121 and an output value 520 of the horizontal tap number counter 122. Comparison result data 525 obtained in the comparator 125 is fed as an end-of-filtering signal to the instruction decoder 130. Comparison result data 527 obtained in the comparator 123 is fed to the shift control circuit 133. Further, an output value 526 of the vertical tap number counter 124 is fed to the index generator 131.

In the circuit configuration mentioned above, when the instruction decoder 130 recognizes an input instruction for filter processing, each tap number control register in the tap number control circuit 100 is updated by using the internal register 132. For filter processing, a source index 530 indicating a base point of data to be read out of the internal register 132 is fed from the instruction decoder 130 to the index generator 131, and a vertical filter offset signal 526 is fed from the tap number control circuit 100 to the index generator 131. Upon receiving these signals, the index generator 131 provides an offset source index 531 to the internal register 132. Then, to the shift register 134 in the arithmetic circuit 122, the internal register 132 outputs register data 533 corresponding to the offset source index 531. In the shift register 134, data shifting is performed under the direction of the shift control circuit 133, or shift register data updating is performed according to the data 533 received from the internal register 134. In a state where horizontal filter processing is in progress, data shifting is performed in the shift register 134. Under this condition, a continuation-of-horizontal-filtering signal 527 is asserted by the tap number control circuit 100. Alternatively, in a state where the continuation-of-horizontal-filtering signal 527 is not asserted or where data retained in the shift register 134 is insufficient, shift register data updating is performed according to the data 533 received from the internal register 132. The shift register 134 feeds resultant data of operation therein to the SIMD arithmetic circuit 135. Then, arithmetic processing result data 136 is written back to the internal register 132 at the end of the filter processing.

In the tap number control circuit 100 mentioned above, horizontal filter processing and vertical filter processing can be carried out simultaneously. Upon receipt of a tap control signal 500 from the instruction decoder 130, the tap number control circuit 100 updates the vertical tap number control register 120 and the horizontal tap number control register 121 according to vertical update data 528 and horizontal update data 529, respectively. Then, for execution of filter processing, a counter reset signal 503 is input to each of the horizontal tap number counter 122 and the vertical tap number counter 124 for counter value resetting. At the start of filter processing, the horizontal tap number counter 122 is incremented by one ("+1"), and in the comparator 123, a judgment is performed on whether an output value of the horizontal tap number control register 121 is equal to an output value of the horizontal tap number counter 122. If the output value of the horizontal tap number control register 121 is not equal to the output value of the horizontal tap number counter 122, it is recognized that the horizontal filter processing concerned is in progress. In this case, data is shifted by one byte position with respect to the shift register 134 for arithmetic processing, i.e., the continuation-of-horizontal-filtering signal 527 is issued to the shift register 134. Alternatively, if the output value of the horizontal tap number control register 121 is equal to the output value of the horizontal tap number counter 122, the vertical tap number counter 124 is incremented by one ("+1"), and the horizontal tap number counter 122 is reset. The vertical tap number counter 124 provides a vertical filter offset signal 526 for compensation of an internal register read-out position. The vertical signal offset signal 526 provided by the vertical tap number counter 124 is fed out of the tap number control circuit 100. Further, in the comparator 125, a judgment is performed on whether an output value of the vertical tap number control register 120 is equal to an output value of the vertical tap number counter 124. If an output value of the vertical tap number control register 120 is equal to an output value of the vertical tap number counter 124, an end-of-filtering signal 525 is asserted.

In accordance with the circuit configuration described above, it is possible to provide a two-dimensional filter processing circuit wherein the vertical tap number control register 120 and the horizontal tap number control register 121 are formed separately to allow tap number setting in each of the horizontal filter processing and vertical filter processing.

In cases where only the vertical filter processing is carried out, the vertical tap number control register 120 alone may be formed with the elimination of the horizontal tap number control register 121, thereby contributing to a reduction in circuit area size.

Likewise, in cases where only the horizontal filter processing is carried out, the horizontal tap number control register 121 alone may be formed with the elimination of the vertical tap number control register 120, thereby contributing to a reduction in circuit area size.

Figure 6:
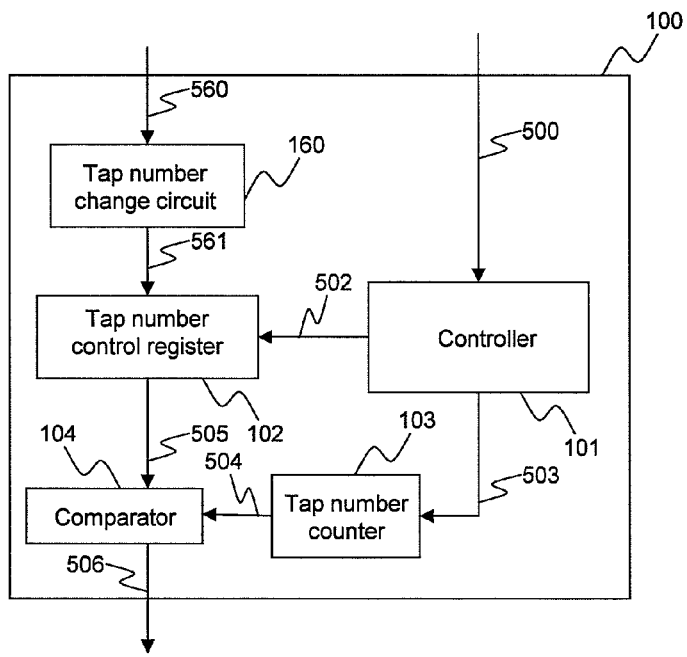
FIG. 6 is a block diagram showing another exemplary configuration of the tap number control circuit illustrated in FIG. 1.

Preferred Embodiment 3:

Referring to FIG. 6, there is shown a block diagram of another exemplary configuration of the tap number control circuit 100.

As compared with the configuration shown in FIG. 2, the tap number control circuit 100 shown in FIG. 6 has a distinctive feature in that a tap number change circuit 160 is provided to allow changing the number of taps according to macroblock information 560.

Upon receipt of a tap control signal 500 from the instruction decoder 130, the tap number control circuit 100 initiates filter processing. First, according to the macroblock information 560, the tap number change circuit 160 determines the number of taps in the filter processing concerned. Note that the macroblock information 560 may be determined based on proportion data of high-frequency components with respect to the DCT (discrete cosine transform) coefficient concerned, or based on quantization coefficient data of the macroblock under processing and macroblocks at the front, back, left, and right positions thereof. The number of taps determined by the tap number change circuit 160 is input to a tap number control register 102 for tap number updating. At the start of filter processing, a tap number counter 103 is initialized by a counter reset signal 503. In the course of filter processing, the tap number counter 103 is incremented by one ("+1") for each tap, and in a comparator 104, a judgment is performed on whether a value retained in the tap number control register 102 is equal to a value indicated by the tap number counter 103. Then, as judgment result data, an equivalence signal 506 is fed to the data generator 111.

In accordance with the circuit configuration described above with reference to FIG. 6, it is possible to provide a filter processing device comprising the tap number control circuit 100 wherein a judgment is performed on the macroblock information 560, and the number of taps is changed according to the result data of judgment, instead of an arrangement wherein a predetermined value is set up.

While the present invention has been described in detail with respect to specific embodiments thereof, it is to be understood that the present invention is not limited by any of the details of description and that various changes and modifications may be made in the present invention without departing from the spirit and scope thereof.

The present invention is effectively applicable to data processing wherein a plurality of filter processing operations are required. While applications to picture data decoding/encoding in the H.264/AVC scheme have been described as exemplary embodiments hereinabove, the present invention is not limited thereto and can also be utilized for other types of applications such as audio data processing.

What is claimed is:

1. A semiconductor device comprising:
an instruction decoder that decodes input instructions;
a tap number control circuit that is capable of controlling the number of taps in filter processing according to a tap control signal applied thereto through the instruction decoder;
an index generator that is capable of generating an offset source index by compensation of a source index received through the instruction decoder;
an internal register that is capable of outputting data corresponding to the source index; and
an arithmetic circuit that performs arithmetic processing for filtering operation on data fed from the internal register;
wherein the arithmetic circuit comprises:
a shift register that is capable of shifting data fed from the internal register; and
a single-instruction multiple-data arithmetic circuit that performs arithmetic processing on output data from the shift register; and
wherein the tap number control circuit comprises:
a horizontal tap number control register that is capable of retaining the number of taps in horizontal filter processing and capable of updating the number of taps retained therein according to update data;
a horizontal tap number counter and a vertical tap number counter, each being arranged to change a count value according to a count value update signal;
a vertical tap number control register that is capable of retaining the number of taps in vertical filter processing and capable of updating the number of taps retained therein according to update data;
a controller that sets up an initial value in each of the horizontal tap number control register and the vertical tap number control register according to a control signal output from the instruction decoder, and that initializes each of the horizontal tap number counter and the vertical tap number counter according thereto;
a first comparator that performs a comparison between a value retained in the horizontal tap number control register and a value indicated by the horizontal tap number counter, and that serves to operate the shift register and to update the vertical tap number counter according to the result of comparison; and
a second comparator that performs a comparison between a value retained in the vertical tap number control register and a value indicated by the vertical tap number counter, and that issues an end-of-filtering signal according to the result of comparison.

2. The semiconductor device according to claim 1, wherein, at each end of horizontal filter processing for one tap, a value indicated by the horizontal tap number counter is updated, and the updated value is compared with data retained in the horizontal tap number control register to check whether the horizontal filter processing concerned has been completed or not, then if it is judged that the horizontal filter processing concerned has not yet been completed, the first comparator asserts a shift signal for shift register operation, and wherein, at each end of vertical filter processing for one tap, a value indicated by the vertical tap number counter is updated, the current number of taps is compared with a register index change signal for changing a register number read out of the internal register, and data indicated by the vertical tap number counter is compared with data retained in the vertical tap number control register to check whether the vertical filter processing concerned has been completed or not, then if it is judged that the vertical filter processing concerned has been completed, the second comparator asserts an end-of-filtering signal.

3. The semiconductor device according to claim 1, wherein, upon receiving, from the instruction decoder, a control signal for updating either one or both of the horizontal tap number control register and the vertical tap number control register, the controller asserts an enable signal for updating either one or both of the horizontal tap number control register and the vertical tap number control register, and wherein, upon receiving, from the instruction decoder, a control signal for starting the execution of a filtering instruction, the controller asserts a reset signal for resetting the horizontal tap number counter and the vertical tap number counter.

4. The semiconductor device according to claim 3, wherein the instruction decoder is configured to decode an instruction that is capable of updating either one or both of the vertical tap number control register and the horizontal tap number control register.

* * * * *